United States Patent [19]

Yamaguchi et al.

[11] Patent Number: 4,663,079
[45] Date of Patent: May 5, 1987

[54] COPPER-TYPE CONDUCTIVE COATING COMPOSITION

[75] Inventors: Shoji Yamaguchi, Yokkaichi; Kimiko Yamada, Nagoya, both of Japan

[73] Assignee: Mitsubishi Petrochemical Co., Ltd., Tokyo, Japan

[21] Appl. No.: 749,463

[22] Filed: Jun. 27, 1985

[30] Foreign Application Priority Data

Jul. 31, 1984 [JP] Japan ................... 59-160893
Sep. 25, 1984 [JP] Japan ................... 59-199738

[51] Int. Cl.$^4$ ........................... H01B 1/22
[52] U.S. Cl. ................... 252/512; 523/455; 523/458; 523/512; 524/106; 524/146; 524/440; 174/102 SC; 174/105 SC; 174/120 SC
[58] Field of Search ........... 523/458, 512, 455; 252/503, 511, 512; 524/106, 146, 440; 174/102 SC, 105 SC, 120 SC, 120 SR

[56] References Cited

U.S. PATENT DOCUMENTS

| | | | |
|---|---|---|---|
| 3,256,237 | 6/1966 | Casey | 524/146 |
| 3,708,387 | 1/1973 | Turner et al. | 252/512 |
| 3,849,370 | 11/1974 | Minagawa et al. | 524/106 |
| 3,852,395 | 12/1974 | Fujisawa et al. | 524/146 |
| 3,983,075 | 9/1976 | Marshall et al. | 252/503 |
| 4,122,143 | 10/1978 | Momotari et al. | 252/512 |

*Primary Examiner*—Veronica P. Hoke
*Attorney, Agent, or Firm*—Oblon, Fisher, Spivak, McClelland, & Maier

[57] ABSTRACT

A copper-type conductive coating composition which comprises:

(A) a copper powder with hydrogen loss of at most 0.2% by weight or a copper powder with its oxidized surface layer removed by treatment with an organic carboxylic acid, (B) a coating binder resin, and (C) an antioxidant selected from triazoles represented by the formula:

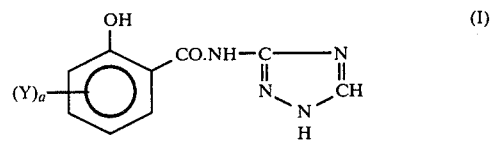

(I)

wherein Y is a hydroxyl group, a hydrogen atom, a $C_1$-$C_{18}$ alkyl group or a halogen atom, and a is an integer of 1 to 3, and trithiophosphites represented by the formula:

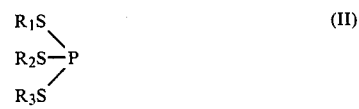

(II)

wherein each of $R_1$ to $R_3$ is a $C_1$-$C_{30}$ alkyl group or an allyl group.

8 Claims, No Drawings

COPPER-TYPE CONDUCTIVE COATING COMPOSITION

The present invention relates to a copper-type conductive coating composition. More particularly, it relates to an excellent copper-type conductive coating composition which is less susceptible to the reduction of electric conductivity and to the formation of patina under various environmental conditions.

A conductive coating composition comprises conductive filler powder (e.g. fine powder of a metal such as gold, silver, copper, nickel, molybdenum or tungsten, or fine powder of carbon such as carbonblack or graphite) dispersed in a solution of a thermoplastic resin such as a polyphenyl ether resin, an acrylic resin or a cellulose resin, or a thermosetting resin such as an epoxy resin or a phenol resin, and it is useful for many purposes, for instance, as a paste for electric circuits, a conductive adhesive or an electromagnetic wave shielding material (U.S. Pat. Nos. 3,983,075, 4,247,594).

Among the above-mentioned various conductive fillers, powders of noble metals such as gold and silver are expensive, and such noble metal powders are used only for conductive coating materials having special purposes. Further, other metal powders except for nickel powder, or carbon powders are inferior in the conductivity or in the retention of the conductivity. For these reasons, nickel powder is most commonly employed as the conductive filler for conductive coating compositions, particularly for shielding purposes.

In recent years, as a result of a rapid expansion of electronic appliances, EMI (Electro Magnetic Interference) has been closed-up as a problem. A technique has been developed to solve this EMI by coating a conductive coating composition. This technique has been commonly known as an EMI shielding technique, and conductive coating compositions have now been commonly used in this field.

A conductive coating composition containing copper powder with its oxidized surface layer removed, as the conductive filler, is superior to the conductive coating composition containing nickel powder, in the initial performance of the coating layer. However, it is inferior in the heat resistance and moisture resistance, and is not practically used since it is likely that the electric conductivity lowers abruptly during its use. The copper powder is inexpensive as compared with the nickel powder, and copper has an electric conductivity about four times that of nickel. Accordingly, if a technique for the prevention of the oxidation of the copper powder were established, the copper powder would be most useful as the conductive filler for conductive coating composition, in place of the nickel powder.

Namely, commercially available copper powder has its surface already oxidized when available. Accordingly, if such copper powder is dispersed in a coating base material as it is, the resulting composition does not show electric conductivity. On the other hand, if the commercially available copper powder is first washed with an aqueous mineral acid solution and then dispersed in a coating base material, the resulting composition shows excellent electric conductivity at the initial stage, but as the oxidation proceeds, the electric conductivity of the coating layer gradually decreases, and in an extreme case, the electric conductivity will be completely lost in a few days. However, once a technique for the prevention of the oxidation of the copper powder is established, it would be possible to advantageously supply at low costs a conductive coating composition by using the copper powder as the conductive filler. Accordingly, various studies have been made for the prevention of the oxidation of the copper powder, and various proposals have already been made.

With respect to the technique for the prevention of the oxidation of the copper powder in conductive coating compositions of this type, various proposals have been made including the one in which phosphorous acid and its derivative are used (Japanese Examined Patent Publication No. 24936/1977), the one in which an anthracene derivative is used (Japanese Unexamined Patent Publication No. 103260/1981), the one in which a formaldehyde-type resin is used (Japanese Examined Patent Publication No. 19315/1977), the one in which a hydroxy phenol derivative (such as hydroquinone or catechol) is used (Japanese Unexamined Patent Publication No. 96401/1982), the one in which an organic acid and a rosin-type substance are used together (Japanese Unexamined Patent Publication No. 95005/1982), the one in which an organic titanate is used (Japanese Unexamined Patent Publication No. 36553/1981), or the mixture of the organic titanate and a phenol-type compound are used together (Japanese Unexamined Patent Publication No. 74759/1983). However, these proposals have been found to show no substantial effects, or if effective, the degree of the effectiveness is far lower than that of the coating compositions in which nickel powder or silver powder is used. Besides, a drawback common to all the proposals is that patina forms on the coating paste or on the coated layer substantially.

The present inventors have conducted extensive researches to overcome the drawback of the formation of patina in the conductive coating composition in which copper powder was used as the conductive filler, and as a result, have found that a coating composition obtained by dispersing in a coating binder resin, a copper powder having a hydrogen loss of at most 0.2% by weight or a copper powder with its oxidized surface layer removed by treatment with an organic carboxylic acid, together with a certain specific antioxidant, has excellent storage stability, moisture resistance, heat resistance, heat cycle resistance, etc., and yet the formation of patina in the coating composition or on the coating layer is minimum, whereby the coating layer maintains its excellent electric conductivity for a long period of time under various environmental conditions. The present invention has been accomplished on the basis of this discovery.

Namely, the present invention provides a copper-type conductive coating composition which comprises:
(A) a copper powder with a hydrogen loss of at most 0.2% by weight or a copper powder with its oxidized surface layer removed by treatment with an organic carboxylic acid,
(B) a coating binder resin, and
(C) an antioxidant selected from triazoles represented by the formula:

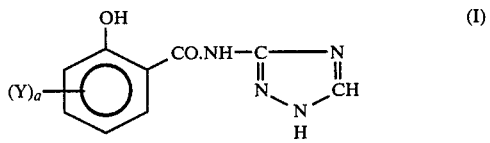

wherein Y is a hydroxyl group, a hydrogen atom, a $C_1$–$C_{18}$ alkyl group or a halogen atom, and a is an integer of 1 to 3, and trithiophosphites represented by the formula:

wherein each of $R_1$ to $R_3$ is a $C_1$–$C_{30}$ alkyl group or an allyl group.

Now, the present invention will be described in detail with reference to the preferred embodiments.

There is no particular restriction for the preparation of the copper powder having a hydrogen loss of at most 0.2% by weight (JSPM Standard 3-63) or the copper powder to be treated with an organic carboxylic acid, to be used in the present invention. The copper powder may be the one obtained by an electrolytic process, the one obtained by an atomizing process, the one obtained by pulverizing process or the one obtained by a reduction process. An electrolytic copper powder is particularly preferred since it gives a coating composition exhibiting high conductivity. The copper powder preferably has a particle size of at most 100 μm. From the viewpoint of the coating properties, it is particularly preferred to employ a copper powder wherein at least 80% by weight is constituted by particles having a particle size of at most 325 mesh (JIS Z-8801). It is possible to employ a combination of two or more different kinds of copper powders prepared by different processes. In the present invention, the copper powder to be treated with an organic carboxylic acid is a copper powder having a hydrogen loss of at least 0.2% by weight.

As the organic carboxylic acid to be used for the removal of the oxidized surface layer of the copper powder in the present invention, there may be mentioned a monocarboxylic acid such as acetic acid or propionic acid, a non-substituted polycarboxylic acid such as succinic acid or tricarballylic acid, or a hydroxy carboxylic acid such as lactic acid, tartaric acid, griceric acid, malic acid, citric acid, gluconic acid, tropic acid, benzilic acid, mandelic acid, atrolactinic acid or glycolic acid. Among these organic carboxylic acids, particularly preferred are hydroxy carboxylic acids. The oxidized surface layer of the copper powder can readily be removed by dipping the copper powder in a solution obtained by dissolving such an organic carboxylic acid in a proper solvent, for a predetermined period of time under a stand-still condition or under stirring. As the solvent for the organic carboxylic acid, water or various organic solvents may be employed. However, from the great solvation capacity of the copper ions, water and an alcohol such as methanol, ethanol or propanol are preferred. After the treatment with the organic carboxylic acid, the copper powder is subjected to filtration, washed with water or alcohol and dried. The copper powder thus obtained by the removal of the oxidized surface layer by the organic carboxylic acid treatment (hereinafter sometimes referred to as "an organic carboxylic acid-treated copper powder") or the copper powder having a hydrogen loss of at most 0.2% by weight, is then incorporated to the conductive coating composition of the present invention. The proportion is usually from 10 to 90% by weight, preferably from 30 to 70% by weight, relative to the coating composition.

In the case where the copper powder is treated with an aqueous mineral acid solution to remove the oxidized layer, instead of the organic carboxylic acid treatment of the present invention, even if the treated copper powder is used together with the same antioxidant as used in the present invention, to form a conductive coating composition, the resulting coating composition scarcely shows the initial electric conductivity, or the oxidation resistance will be substantially poor as compared with the one in which the copper powder treated by the organic carboxylic acid treatment is used.

Then, the antioxidant (C) is incorporated to the conductive coating composition of the present invention. The antioxidant is a triazole represented by the above-mentioned formula (I) or a trithiophosphite represented by the formula (II).

As the triazole of the formula (I), the one in which Y is a hydrogen atom [3-(N-salicyloyl)amino-1,2,4-triazole] is commercially available from Adeca-Argus Chemical Co. Ltd. under a tradename of MARK CDA-1 or MARK CDA-1M. These commercially available products may suitably be employed.

As the trithiophosphite of the formula (II), $C_{12}$ products are commercially available under various tradenames such as Chelex LT-3 (tradename, manufactured by Sakai Chemical Industries, Co. Ltd.), JPS 312 (tradename, manufactured by Jyohoku Chemical Industries Co., Ltd.), TLTTP (tradename, manufactured by Hooker Chemical) and PS-36S (tradename, manufactured by Daihachi Chemical Industries Co., Ltd.). These commercial products may suitably be employed.

The proportion of the antioxidant in the copper-type conductive coating composition of the present invention, may vary depending upon the type of the antioxidant and the purpose of the coating composition, but is usually within a range of from 0.01 to 5% by weight, preferably from 0.1 to 2% by weight, relative to the copper powder having a hydrogen loss at most 0.2% by weight or the copper powder treated with an organic carboxylic acid.

The coating composition of the present invention is obtained by mixing and dispersing the above-mentioned copper powder having a hydrogen loss of at most 0.2% by weight or the copper powder treated with an organic carboxylic acid, and the antioxidant in a suitable coating binder resin in a predetermined ratio.

As such a coating binder resin, it is possible to use almost all conventional coating binder resins, for instance, thermoplastic resins such as acrylic resins, vinyl resins, cellulose resins and vinyl chloride/vinyl acetate copolymer resins; or thermosetting resins such as epoxy resins, urethane resins, thermosetting acrylic resins, phenol resins, melamine resins or alkyd resins. These binder resins may, if necessary, be used in combination as a mixture of two or more different kinds.

These coating binder resins are usually used together with a suitable organic solvent, particularly in the case where the resins have a high viscosity. The organic solvent varies depending upon the type of the binder resin. As specific examples of the organic solvent, there may be mentioned an aromatic hydrocarbon such as toluene or xylene; an alcohol such as isopropanol or butanol; a ketone such as methyl ethyl ketone or methyl isobutyl ketone; an ester such as ethyl acetate or butyl acetate; or a cellusolve such as ethyl cellusolve or butyl cellusolve. Binder resins may be used alone or in combination as a mixture of two or more different kinds, depending upon the type of the binder resin. Further, in the case where the object to be coated is made of a plastic, it is necessary to take due care so that the solvent does not dissolve the object. The conductive coating composition of the present invention may be formulated in any desired type such as a one-pack quick drying type composition in which e.g. a thermoplastic acrylic resin is used as the binder resin, or a two-pack type composition wherein e.g. a urethane resin or epoxy resin is employed.

It is desired to select the proportions of the respective components for the preparation of the conductive coating composition of the present invention so that the conductivity of the coating layer of the composition becomes to be the maximum, and yet the conductivity is maintained for a long period of time. For instance, the representative proportions for a conductive coating composition for spray coating or brush coating, are within the following ranges:
  (A) from 40 to 60% by weight of a copper powder having a hydrogen loss of at most 0.2% by weight or a copper powder treated with an organic carboxylic acid;
  (B) from 5 to 20% by weight of a binder resin;
  (C) from 0.01 to 5% by weight of an antioxidant; and
  (D) from 20 to 55% by weight of an organic solvent.

When used for a conductive paste or ink, the coating composition of the present invention comprises:
  (A) from 10 to 90% by weight of the copper powder;
  (B) from 10 to 90% by weight of the binder resin; and
  (C) from 0.01 to 5% by weight of the antioxidant.

In addition to the above-mentioned various components, it is possible to incorporate various additives to the conductive coating composition of the present invention, as the case requires. Particularly, for the prevention of the sedimentation of the copper powder, it is advisable to incorporte various sedimentation-preventing agents such as thickening agents or thixotropic thickeners in an amount not to impair the electric conductivity. As such sedimentation-preventing agents, there may be mentioned, for instance, hydrogenated castor oil, a metallic soap, an aluminum chelate, an organic bentonite, a colloidal silica, an oxidized polyethylene wax, a long chain polyamino amide, and a polycarboxylic acid alkyl amine. These sedimentation-preventing agents may be used alone or in combination as a mixture of two or more different kinds.

Particularly preferred sedimentation-preventing agents are aliphatic amides represented by the formula $RCONH_2$ or $(RCONH)_2A$, wherein R is a $C_5$–$C_{21}$ alkyl group, and A is a $C_1$–$C_6$ alkylene group, or a mixture of such an aliphatic amide with a wax. As specific examples of such aliphatic amides, there may be mentioned monoamides such as oleic acid amide, capronic acid amide, linolic acid amide or behelic acid amide; or bis-amides such as N,N'-methylene-bis-stearic acid amide or N,N'-ethylene-bis-stearic acid amide. Further, as a mixture of the aliphatic amide and the wax, there may be mentioned a mixture obtained by pulverizing the above-mentioned bis-amide and a polyolefin wax having a molecular weight of from 1000 to 8000 together (Japanese Unexamined Patent Publication No. 65056/1981).

To the conductive coating composition of the present invention, there may be added a levelling agent (such as silicone or a high boiling point ketone), a surfactant, a fire retardant, or the like, as the case requires. Further, the triazole of the formula (I) or the trithiophosphite of the formula (II) may be used in combination with the antioxidants disclosed in Japanese Patent Application No. 107518/1984, such as phosphoric acid esters, phosphor thiazinic acid derivatives, alkyl imidazoles, organic carboxylic acid salts of alkyl imidazoles, nitrogen-type silane coupling agents, sulfur-type silane coupling agents, phenothiazine, thionine or stearyl propylene diamine.

For the preparation of the conductive coating composition of the present invention, the above-mentioned binder resin, the copper powder treated with an organic carboxylic acid, the antioxidant, the solvent, and various other necessary additives are suitably mixed, and formed into a coating composition by means of a dispersing device commonly employed for the preparation of the coating compositions (such as a disper, a ball mill, a sand mill, a triple rolls, or a Foover's Muller). The conductive coating composition of the present invention thus obtained, may be coated or printed on an object by a suitable method such as spraying, brush coating, dipping, off-set printing or screen printing, to obtain an excellent conductive coating layer having remarkably high electric conductivity, which is yet less susceptible to the reduction of the conductivity and to the formation of patina.

Now, the present invention will be described in further detail with reference to Examples and Comparative Examples. In these Examples, "parts" means "parts by weight", and "%" means "% by weight". It should be understood that the present invention is by no means restricted by these specific Examples.

The volume specific resistance indicated in these Examples, was measured in accordance with the following method.

A copper-lined laminated plate prepared by pasting a copper foil on a plastic plate (i.e. a laminated plate of glass-reinforced epoxy resin) and having a width of 5 cm and a length of 10 cm was subjected to etching treatment to remove the copper foil at the center portion to obtain a base plate A with a copper foil portions with a width of 1.5 cm left at both ends of the plastic plate (the distance between the copper foil portions of the base plate being 7 cm). A conductive coating composition was coated onto this base plate in a width of 1 cm, and the formed coating layer was left under various environmental conditions for a predetermined period of time, whereupon the thickness of the coating layer was measured by a digital micrometer (Degimatic Indicator 543, manufactured by Kabushiki Kaisha Mitoyo Seisakusho), and the electric resistance was measured by a Wheatstone's bridge (Type 2755, manufactured by Yokokawa Electric Works, Ltd.), and the volume resistivity was calculated in accordance with the following equation.

$$\text{Volume resistivity resistance } (\Omega \cdot cm) = \frac{\text{Measured resistance } (\Omega) \times \text{thickness (cm)} \times \text{width (cm)}}{\text{Length (cm)}}$$

$$= \frac{\text{Measured resistance} \times \text{thickness}}{7}$$

EXAMPLE 1

To 100 parts of a commercially available electrolytic copper powder for industrial use (325 mesh pass at least 90%; hydrogen loss: 0.23% by weight), 400 parts of a 10% citric acid aqueous solution was added, and after stirring 15 hours by a stirrer, the mixture was filtered to separate the copper powder. The copper powder was thoroughly washed with water and dried.

To 100 parts of the copper powder thus obtained, 1 part of 3-(N-salicyloyl)amino-1,2,4-triazole (MARK CDA-1, manufactured by Adeca Argus Chemical), 100 parts of a 40% toluene solution of a commercially available polymethyl methacrylate (molecular weight: about 100,000, a reagent manufactured by Wako Junyaku Co.) and 40 parts of methyl ethyl ketone were added, and the mixture was dispersed by a high speed disper to obtain a conductive coating composition.

This coating composition was coated on the base plate in the manner as described above, and left at 23° C. under a relative humidity of 50% for 24 hours, whereupon the volume resistivity was measured and found to be $7.4 \times 10^{-4}$ Ω.cm. Further, this coating layer was left in heated air of 85° C. for 1000 hours, whereupon the volume resistivity was measured and found to be $7.8 \times 10^{-4}$ Ω.cm. Further, the coating layer of the coating composition and the coating solution itself were left at room temperature in air for 1000 hours, whereupon the formation of patina was examined respectively. As shown in Table 1, no formation of patina was observed in both the coating layer and the coating composition. Further, the coating composition was stored in a closed container at 23° C. under a relative humidity of 50% for 1000 hours, and then applied onto the base plate. With respect to the sample thus obtained, the measurement of resistance was conducted in a similar manner, whereby no substantial change was observed as shown in Table 1.

EXAMPLE 2

To 100 parts of an electrolytic copper powder for industrial use having a hydrogen loss of 0.15% by weight (JSPM 3-63), one part of 3-(N-salicyloyl)amino-1,2,3-triazole (MARK CDA-1M, tradename, manufactured by Adeca Argus Chemical), 100 parts of a 40% toluene solution of an acrylic resin (Dianal BR-102, tradename, manufactured by Mitsubishi Rayon Co., Ltd.), 60 parts of methyl ethyl ketone, and 2 parts of Ceridust 9615A (tradename for an amide-modified wax, manufactured by Hechest Co.) were added, and the mixture was dispersed by a high speed disper to obtain a conductive coating composition.

This coating composition was coated in the same manner as in Example 1, and left in the same manner, whereupon the volume resistivity was measured, and found to be $8.1 \times 10^{-4}$ Ω.cm after being left for 24 hours, and $8.6 \times 10^{-4}$ Ω.cm after being left for 1000 hours. Further, the coating layer of this coating composition and the coating solution were left for 1000 hours in the same manner as in Example 1, whereupon the formation of patina was examined, and the resistance after the storage in a closed container at 23° C. under a relative humidity of 50% for 1000 hours, was measured. The results are shown in Table 1.

COMPARATIVE EXAMPLES 1 AND 2

A conductive coating composition was prepared in the same manner as in Example 1 except that 3-(N-salicyloyl) amino-1,2,4-triazole (MARK CA-1) was not incorporated at all (Comparative Example 1).

Further, a conductive coating composition was prepared in the same manner as in Example 1 except that instead of the copper powder treated with citric acid in Example 1, the electrolytic copper powder for industrial use in Example 1 was used by itself, and 3-(N-salicyloyl) amino-1,2,4-triazole was not incorporated at all (Comparative Example 2). With respect to the each coating composition thus obtained, the volume resistivity, the formation of patina and the storage stability were tested in the same manner as in Example 1. The results are shown in Table 1.

COMPARATIVE EXAMPLE 3

To 100 parts of the same commercially available electrolytic copper powder for industrial use as used in Example 1, 100 parts of a 5% hydrochloric acid aqueous solution was added, and after stirring for 15 hours by a stirrer, the copper powder was filtered and separated, and then it was thoroughly washed with water, centrifugally separated and dried.

A conductive coating composition was obtained in the same manner as in Example 1 by using this copper powder treated with hydrochloric acid instead of the copper powder treated with citric acid in Example 1. The initial volume resistivity of the coating layer of this coating composition was $2.5 \times 10^{-3}$ Ω.cm, but after being left in air of 85° C. for 1000 hours, the volume resistivity became $1.7 \times 10^{-2}$ Ω.cm i.e. about 10 times higher, and yet the formation of patina on the coating layer and in the coating solution was remarkable as shown in Table 1, and the storage stability was poor.

EXAMPLE 3

A conductive coating composition was obtained in the same manner as in Example 1 except that treatment with an aqueous succinic acid solution was conducted instead of the treatment with an aqueous citric acid solution.

With respect to the coating composition thus obtained, the same tests as in Example 1 were conducted. The results are shown in Table 1.

EXAMPLE 4

A conductive coating composition was prepared in the same manner as in Example 1 except that treatment with an aqueous acetic acid solution was conducted instead of the treatment with an aqueous citric acid solution.

With respect to the coating composition thus obtained, the same tests as in Example 1 were conducted. The results are shown in Table 1.

TABLE 1

| | Copper powder | | | Volume resistivity (Ω · cm) | | | Formation of patina after being left for 1000 hrs.*2 |
| --- | --- | --- | --- | --- | --- | --- | --- |
| | Hydrogen loss (wt. %) | Acid treatment | Antioxidant | After being left at 23° C. under RH of 50% for 24 hrs. | After being left in air of 85° C. for 1000 hrs. | After being stored at 23° C. under RH of 50% for 1000 hrs. | Coating layer/ Coating solution |
| Example 1 | 0.23 | Citric acid | MARK CDA-1*1 | $7.4 \times 10^{-4}$ | $7.8 \times 10^{-4}$ | $8.5 \times 10^{-4}$ | A/A |

TABLE 1-continued

| | Copper powder | | | Volume resistivity ($\Omega \cdot$ cm) | | | Formation of patina after being left for 1000 hrs.[*2] |
| --- | --- | --- | --- | --- | --- | --- | --- |
| | Hydrogen loss (wt. %) | Acid treatment | Antioxidant | After being left at 23° C. under RH of 50% for 24 hrs. | After being left in air of 85° C. for 1000 hrs. | After being stored at 23° C. under RH of 50% for 1000 hrs. | Coating layer/ Coating solution |
| Example 2 | 0.15 | Nil | MARK CDA-1M[*1] | $8.1 \times 10^{-4}$ | $8.6 \times 10^{-4}$ | $8.8 \times 10^{-4}$ | A/A |
| Example 3 | 0.23 | Succinic acid | MARK CDA-1[*1] | $1.2 \times 10^{-3}$ | $2.3 \times 10^{-3}$ | $2.4 \times 10^{-3}$ | A/A |
| Example 4 | 0.23 | Acetic acid | MARK CDA-1[*1] | $3.0 \times 10^{-3}$ | $3.5 \times 10^{-3}$ | $4.1 \times 10^{-3}$ | A/A |
| Comparative Example 1 | 0.23 | Citric acid | Nil | $8.1 \times 10^{-4}$ | $5.2 \times 10^{-3}$ | $8.2 \times 10^{-3}$ | B/B |
| Comparative Example 2 | 0.23 | Nil | Nil | $5.8 \times 10^{-2}$ | $2.0 \times 10^{0}$ | $8.1 \times 10^{-1}$ | B/C |
| Comparative Example 3 | 0.23 | Hydrochloric acid | MARK CDA-1[*1] | $2.5 \times 10^{-3}$ | $1.7 \times 10^{-2}$ | $7.6 \times 10^{-1}$ | C/C |

Notes:
[*1]Tradename, manufactured by Adeca Argus Chemical Co.
[*2]The coating layer and the coating solution were left in air at room temperature for 1000 hours, whereupon the formation of patina was examined, respectively, and evaluated in accordance with the following standards:
A: No substantial formation of patina was observed.
B: Formation of patina was observed slightly.
C: Substantial formation of patina was observed.

EXAMPLE 5

To 100 parts of a commercially available electrolytic copper powder for industrial use (325 mesh pass at least 90%; hydrogen loss: 0.25% by weight), 400 parts of a 10% aqueous citric acid solution was added, and after stirring for 15 hours by a stirrer, the mixture was filtered to separate the copper powder. The copper powder thus obtained was thoroughly washed with water and dried.

To 100 parts of the copper powder thus obtained, 1 part of a commercially available trilauryl trithiophosphite (JPS-312, tradename, manufactured by Jyohoku Chemical Industries), 100 parts of a 40% toluene solution of a commercially available polymethyl methacrylate (molecular weight: about 100,000, a reagent manufactured by Wako Junyaku Co.) and 60 parts of methyl ethyl ketone, were added, and the mixture was dispersed by a high speed disper to obtain a conductive coating composition.

This coating composition was coated onto the base plate in the manner as described above, and left at 23° C. under a relative humidity of 50% for 24 hours, whereupon the volume resistivity was measured and found to be $8.0 \times 10^{-4}$ $\Omega$.cm. Further, this coating layer was left in heated air of 85° C. for 1000 hours, whereupon the volume resistivity was measured and found to be $8.5 \times 10^{-4}$ $\Omega$.cm. Furthermore, the coating layer of this coating composition and the coating solution itself were left in air at room temperature for 1000 hours, whereupon the formation of patina was examined, respectively. As shown in Table 1, no formation of patina was observed in both the coating layer and the coating composition. Further, the composition was stored in a closed container at 23° C. under a relative humidity of 50% for 1000 hours, and then applied onto the base plate. With respect to the sample thereby obtained, the resistance was measured in the same manner, whereby no substantial change was observed as shown in Table 2.

EXAMPLE 6

To 100 parts of an electrolytic copper powder for industrial use having a hydrogen loss of 0.17% by weight (JSPM 3-63), 1 part of a commercially available trilauryl trithiophosphite (Chelex LT-3, tradename, manfuactured by Sakai Kagaku Kogyo), 100 parts of a 40% toluene solution of an acrylic resin (Acryloid A-11, tradename, manfuactured by Rohm & Haas Co.), 60 parts of methyl ethyl ketone and 2 parts of Ceridust 9615A (tradename for an amide-modified wax manufactured by Hechest Co.) were added, and the mixture was dispersed by a high speed disper to obtain a conductive coating composition.

This coating composition was coated in the same manner as in Example 5, and left in the same manner, whereupon the volume resistivity was measured and found to be $7.4 \times 10^{-4}$ $\Omega$.cm. after being left for 24 hours and $8.1 \times 10^{-4}$ $\Omega$.cm after being left for 1000 hours. Further, the coating layer of this coating composition and the coating solution were left for 1000 hours in the same manner as in Example 1, whereupon the formation of patina was examined, and the resistance after the storage in the closed container at 23° C. under a relative humidity of 50% for 1000 hours, was measured. The results are shown in Table 2.

COMPARATIVE EXAMPLES 4 AND 5

A conductive coating composition was prepared in the same manner as in Example 5 except that trilauryl trithiophosphite (JPS-312) in Example 5 was not incorporated at all (Comparative Example 4).

Further, a conductive coating composition was prepared in the same manner as in Example 5 except that instead of the copper powder treated with citric acid in Example 5, the electrolytic copper powder for industrial use in Example 5 was used by itself, and trithiophosphite was not incorporated at all (Comparative Example 5).

With respect to each coating composition, the volume resistivity, the formation of patina and the storage stability were tested in the same manner as in Example 5. The results are shown in Table 2.

COMPARATIVE EXAMPLE 6

To 100 parts of the same commercially available electrolytic copper powder for industrial use as used in Example 5, 100 parts of a 5% hydrochloric acid aqueous solution was added, and after stirring for 15 hours by a stirrer, the copper powder was filtered and separated, and then thoroughly washed, centrifugally separated and dried.

A conductive coating composition was obtained in the same manner as in Example 5 by using this copper powder treated with hydrochloric acid instead of the copper powder treated with citric acid in Example 5. The initial volume resistivity of the coating layer of this coating composition was $1.0 \times 10^{-3}$ Ω.cm, but after being left in air at 85° C. for 1000 hours, the volume resistivity became to be $2.8 \times 10^{-2}$ Ω.cm, i.e. about 10 times higher, and yet the formation of patina was remarkable on the coating layer and in the coating solution, and the storage stability was poor, as shown in Table 2.

EXAMPLE 7

A conductive coating composition was obtained in the same manner as in Example 5 except that treatment with an aqueous succinic acid solution was conducted instead of the treatment with an aqueous citric acid solution.

With respect to the coating composition thus obtained, the same tests as in Example 5 were conducted. The results are shown in Table 2.

EXAMPLE 8

A conductive coating composition was prepared in the same manner as in Example 5 except that treatment with an aqueous acetic acid solution was conducted instead of the treatment with the aqueous citric acid solution.

With respect to the coating composition thus obtained, the same tests as in Example 5 were conducted. The results are shown in Table 2.

The above mixture was kneaded to obtain a conductive coating. This paste was screen-printed with a width of 1 cm on the base plate by means of a 200 mesh Tetoron screen to form a conductive coating layer. The coating layer was left at 23° C. under a relative humidity of 50% for 72 hours, whereupon the volume resistivity was measured and found to be $5.2 \times 10^{-4}$ Ω.cm. Further, this coating layer was left in heated air of 85° C. for 1000 hours, whereupon the volume resistivity was measured and found to be $6.3 \times 10^{-4}$ Ω.cm, and no formation of patina was observed on the surface.

It is evident from the comparison of the Examples and Comparative Examples that the coating compositions of Examples of the present invention are superior in the electric conductivity, and exhibit no substantial reduction of the conductivity and no formation of patina even when left under various environmental conditions.

We claim:

1. A copper-type conductive coating composition which comprises:
   (A) a copper powder with hydrogen loss of at most 0.2% by weight or a copper powder with its oxidized surface layer removed by treatment with an organic carboxylic acid,
   (B) a coating binder resin, and
   (C) an antioxidant trithiophosphites represented by the formula:

(II)

TABLE 2

| | Copper powder | | | Volume resistivity (Ω · cm) | | | Formation of patina after being left for 1000 hrs.*3 |
|---|---|---|---|---|---|---|---|
| | Hydrogen loss (wt. %) | Acid treatment | Antioxidant | After being left at 23° C. under RH of 50% for 24 hrs. | After being left in air of 85° C. for 1000 hrs. | After being stored at 23° C. under RH of 50% for 1000 hrs. | Coating layer/ Coating solution |
| Example 5 | 0.25 | Citric acid | JPS-312*1 | $8.0 \times 10^{-4}$ | $8.5 \times 10^{-4}$ | $8.8 \times 10^{-4}$ | A/A |
| Example 6 | 0.17 | Nil | Chelex LT-3*2 | $7.4 \times 10^{-4}$ | $8.1 \times 10^{-4}$ | $8.0 \times 10^{-4}$ | A/A |
| Example 7 | 0.25 | Succinic acid | JPS-312*1 | $1.0 \times 10^{-3}$ | $2.1 \times 10^{-3}$ | $1.5 \times 10^{-3}$ | A/A |
| Example 8 | 0.25 | Acetic acid | JPS-312*1 | $2.5 \times 10^{-3}$ | $4.0 \times 10^{-3}$ | $3.5 \times 10^{-3}$ | A/A |
| Comparative Example 4 | 0.25 | Citric acid | Nil | $8.4 \times 10^{-4}$ | $7.6 \times 10^{-3}$ | $4.6 \times 10^{-3}$ | B/B |
| Comparative Example 5 | 0.25 | Nil | Nil | $3.1 \times 10^{-2}$ | $5.5 \times 10^{0}$ | $8.0 \times 10^{0}$ | B/C |
| Comparative Example 6 | 0.25 | Hydrochloric acid | JPS-312*1 | $1.1 \times 10^{-3}$ | $4.3 \times 10^{-2}$ | $5.0 \times 10^{-1}$ | C/C |

Notes:
*1Tradename, manufactured by Jyohoku Kagaku Kogyo.
*2Tradename, manufactured by Sakai Chemical Industry.
*3The coating layer and the coating solution were left in air at room temperature for 1000 hours, whereupon the formation of patina was examined, respectively, and evaluated in accordance with the following standards:
A: No substantial formation of patina was observed.
B: Formation of patina was observed slightly.
C: Substantial formation of patina was observed.

EXAMPLE 9

By using the same citric acid-treated copper powder as used in Example 1, a mixture having the following composition was prepared:

| | |
|---|---|
| (a) Citric acid-treated copper powder | 100 parts by weight |
| (b) Epoxy resin Epikote #815 (Tradename, manufactured by Shell Chemical Company) | 16 parts by weight |
| (c) Hardener Epicure #3025 (Tradename, manufactured by Shell Chemical Company) | 8 parts by weight |
| (d) 3-(N—salicyloyl)amino-1,2,4-triazole (CDA-1) | 1 part by weight | wherein each of $R_1$ to $R_3$ is a $C_1$-$C_{30}$ alkyl group or an allyl group in an amount effective to prevent oxidation of the copper powder.

2. The copper-type conductive coating composition according to claim 1, wherein component (C) is trilauryl trithiophosphite.

3. The copper-type conductive coating composition according to claim 1, wherein the organic carboxylic acid is citric acid.

4. The copper-type conductive coating composition according to claim 1, which comprises:
   (A) from 10 to 90% by weight of the copper powder;

(B) from 10 to 90% by weight of the binder resin; and (c) from 0.01 to 5% by weight of the antioxidant.

5. The copper-type conductive coating composition according to claim 1, wherein the copper powder is an electrolytic copper powder.

6. A copper-type conductive coating composition which comprises:

(A) from 40 to 60% by weight of a copper powder with hydrogen loss of at most 0.2% or a copper powder with its oxidized surface layer removed by treatment with an organic carboxylic acid, (B) from 5 to 20% by weight of a coating binder resin, (C) from 0.01 to 5% by weight of an antioxidant trithiophosphites represented by the formula:

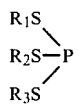

wherein each of $R_1$ to $R_3$ is a $C_1$–$C_{30}$ alkyl group or an allyl group and (D) from 20 to 55% by weight of an organic solvent.

7. The copper-type conductive coating composition according to claim 6, wherein component (C) is trilauryl trithiophosphite.

8. The copper-type conductive coating composition according to claim 6, wherein the organic carboxylic acid is citric acid.

* * * * *